(12) United States Patent
Goto

(10) Patent No.: US 10,304,960 B2
(45) Date of Patent: May 28, 2019

(54) VERTICAL TRANSISTOR WITH MULTI-DOPING S/D REGIONS

(71) Applicant: TOSHIBA MEMORY CORPORATION, Minato-ku, Tokyo (JP)

(72) Inventor: Masakazu Goto, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/909,348

(22) Filed: Mar. 1, 2018

(65) Prior Publication Data

US 2019/0088792 A1 Mar. 21, 2019

(30) Foreign Application Priority Data

Sep. 15, 2017 (JP) ................ 2017-178237

(51) Int. Cl.
*H01L 29/786* (2006.01)
*H01L 27/24* (2006.01)
(Continued)

(52) U.S. Cl.
CPC .... *H01L 29/78642* (2013.01); *H01L 27/2454* (2013.01); *H01L 27/2481* (2013.01);
(Continued)

(58) Field of Classification Search
CPC ......... H01L 27/2454; H01L 21/823487; H01L 21/823885; H01L 21/02603; H01L 29/7827–29/7828; H01L 29/66666; H01L 29/0676; H01L 29/775; H01L 29/66469; H01L 29/78642; H01L 29/42392; H01L 29/1037; H01L 27/228; H01L 43/02; H01L 43/08; H01L 43/10; H01L 43/12; H01L 27/2481; H01L 29/66742; H01L 29/78696; H01L 29/78618; H01L 29/78621; H01L 29/78627; H01L 29/7863; H01L 21/823418; H01L 29/7833; H01L 29/7834;
(Continued)

(56) References Cited

U.S. PATENT DOCUMENTS 5,283,455 A 2/1994 Inoue et al.
6,323,525 B1 * 11/2001 Noguchi ............. H01L 21/2257
257/344

(Continued)

*Primary Examiner* — Marc Anthony Armand
*Assistant Examiner* — Younes Boulghassoul
(74) *Attorney, Agent, or Firm* — Foley & Lardner LLP

(57) ABSTRACT

An integrated circuit device includes a first wiring, a second wiring, a semiconductor member that is connected between the first and second wirings, an electrode, and an insulating film that is provided between the semiconductor member and the electrode. The semiconductor member includes a first semiconductor portion of a first conductivity type connected to the first wiring, a second semiconductor portion of the first conductivity type, a third semiconductor portion of the first conductivity type, a fourth semiconductor portion of the first conductivity type, a fifth semiconductor portion of a second conductivity type, and a sixth semiconductor portion of the first conductivity type in this order. A first edge of the electrode on a side of the first wiring overlaps the second, third, or fourth semiconductor portions.

15 Claims, 15 Drawing Sheets

(51) Int. Cl.
  *H01L 29/66* (2006.01)
  *H01L 29/78* (2006.01)
(52) U.S. Cl.
  CPC .. *H01L 29/66666* (2013.01); *H01L 29/66742* (2013.01); *H01L 29/66787* (2013.01); *H01L 29/7827* (2013.01); *H01L 29/78618* (2013.01); *H01L 29/78621* (2013.01); *H01L 29/78627* (2013.01); *H01L 29/78696* (2013.01)
(58) Field of Classification Search
  CPC ......... H01L 29/7835; H01L 2029/7863; G11C 11/14–11/1697; G11C 2211/5615; H01F 10/392
  See application file for complete search history.

(56) References Cited

U.S. PATENT DOCUMENTS

| | | | |
|---|---|---|---|
| 8,912,594 B2 | 12/2014 | Fujiki et al. | |
| 8,946,670 B1* | 2/2015 | Park | H01L 27/2436 257/2 |
| 2012/0074488 A1* | 3/2012 | Kim | H01L 27/228 257/328 |
| 2013/0334488 A1* | 12/2013 | Park | H01L 27/2454 257/4 |
| 2014/0239247 A1* | 8/2014 | Park | H01L 27/2454 257/4 |
| 2015/0255510 A1* | 9/2015 | Nishimura | H01L 27/2454 257/5 |
| 2015/0255511 A1* | 9/2015 | Takagi | H01L 45/08 365/63 |
| 2015/0255619 A1* | 9/2015 | Shimabukuro | H01L 29/78642 257/314 |
| 2015/0340605 A1* | 11/2015 | Tajima | H01L 27/2454 257/4 |
| 2015/0349252 A1* | 12/2015 | Tajima | H01L 45/04 257/4 |
| 2015/0364381 A1* | 12/2015 | Choi | H01L 21/823487 438/268 |

* cited by examiner

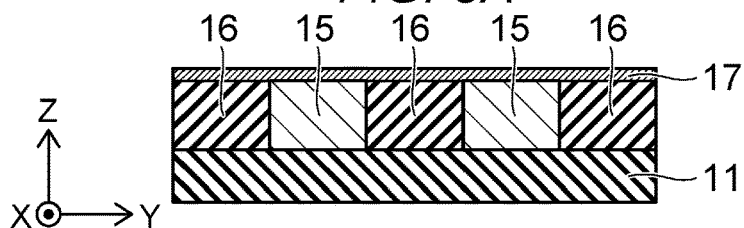
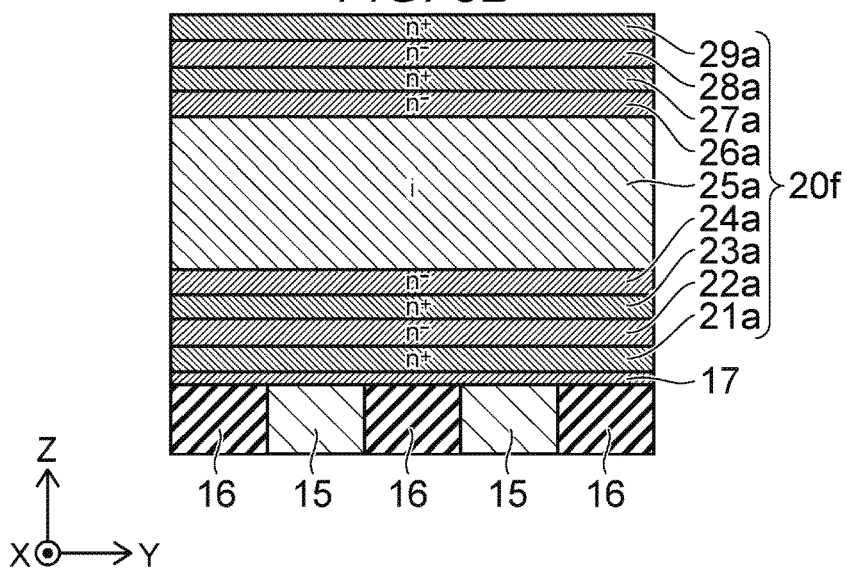
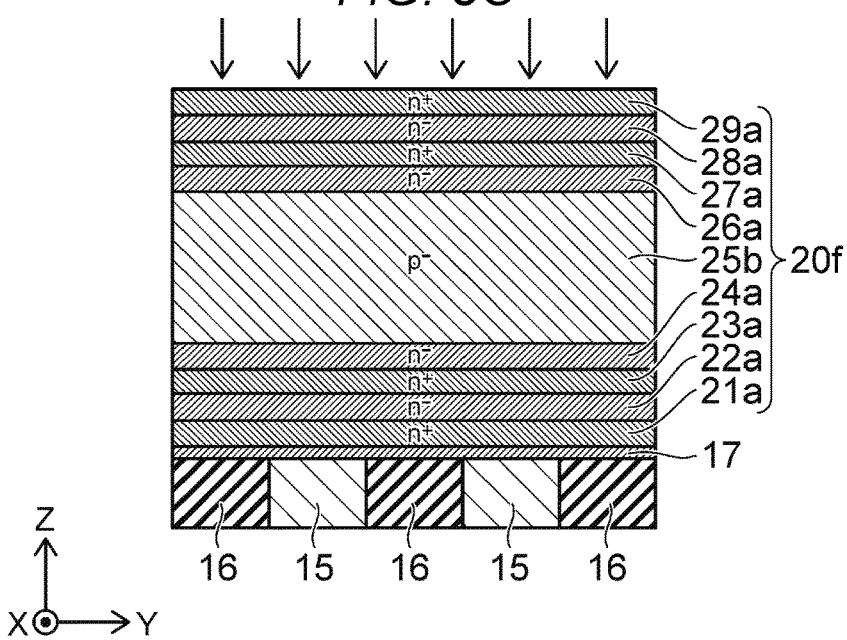

US 10,304,960 B2

VERTICAL TRANSISTOR WITH MULTI-DOPING S/D REGIONS

CROSS-REFERENCE TO RELATED APPLICATION

This application claims the benefit of and priority to Japanese Patent Application No. 2017-178237, filed Sep. 15, 2017, the entire contents of which are incorporated herein by reference.

FIELD

Embodiments described herein relate generally to an integrated circuit device.

BACKGROUND

In recent years, storage devices in which resistance-variable films are connected between two types of wirings extending in directions orthogonal to each other have been proposed. Thus, two-terminal type memory cells can be integrated three-dimensionally, thereby achieving large capacitance. For such storage devices, it is also necessary to reduce power consumption.

DESCRIPTION OF THE DRAWINGS

FIGS. 5A to 5C are sectional views illustrating a method of manufacturing the integrated circuit device according to the first embodiment;

DETAILED DESCRIPTION

Exemplary embodiments provide an integrated circuit device in which power consumption is small.

According to some embodiments, an integrated circuit device comprises: a first wiring; a second wiring; a semiconductor member that is connected between the first and second wirings; an electrode; and an insulating film that is provided between the semiconductor member and the electrode. The semiconductor member includes a first semiconductor portion of a first conductivity type connected to the first wiring, a second semiconductor portion of the first conductivity type in which a concentration of a first impurity is lower than a concentration of the first impurity of the first semiconductor portion, a third semiconductor portion of the first conductivity type in which the concentration of the first impurity is higher than the concentration of the first impurity of the second semiconductor portion, a fourth semiconductor portion of the first conductivity type in which the concentration of the first impurity is lower than the concentration of the first impurity of the third semiconductor portion, a fifth semiconductor portion of a second conductivity type; and a sixth semiconductor portion of the first conductivity type. The first, second, third, fourth, fifth, and sixth semiconductor portions are arrayed in this order in a first direction oriented from the first wiring to the second wiring. When viewed in a second direction oriented from the electrode to the semiconductor member, a first edge of the electrode on a side of the first wiring overlaps the second, third, or fourth semiconductor portion.

First Embodiment

Hereinafter, a first embodiment will be described.

Figure 1:
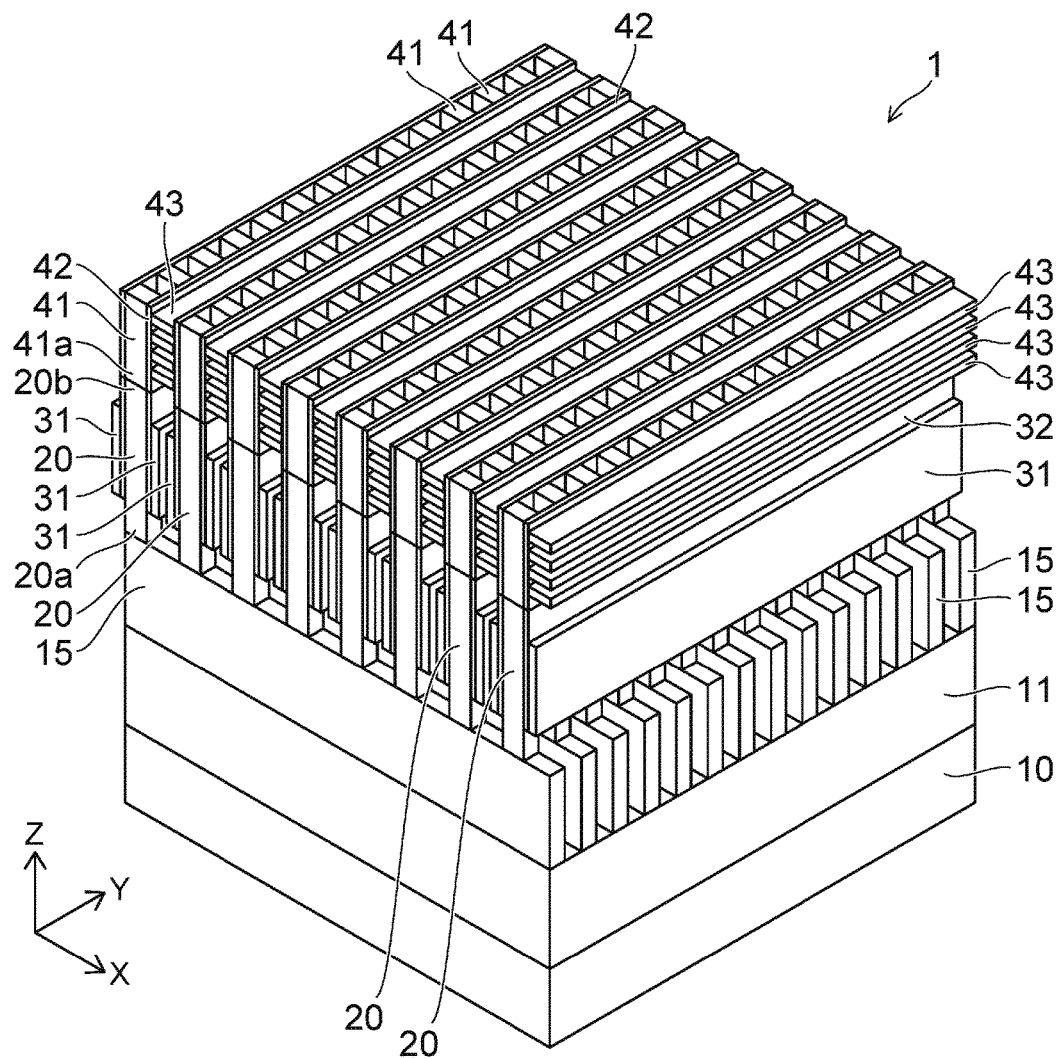
FIG. 1 is a perspective view illustrating an integrated circuit device according to a first embodiment.

FIG. 1 is a perspective view illustrating an integrated circuit device according to the embodiment.

Figure 2:
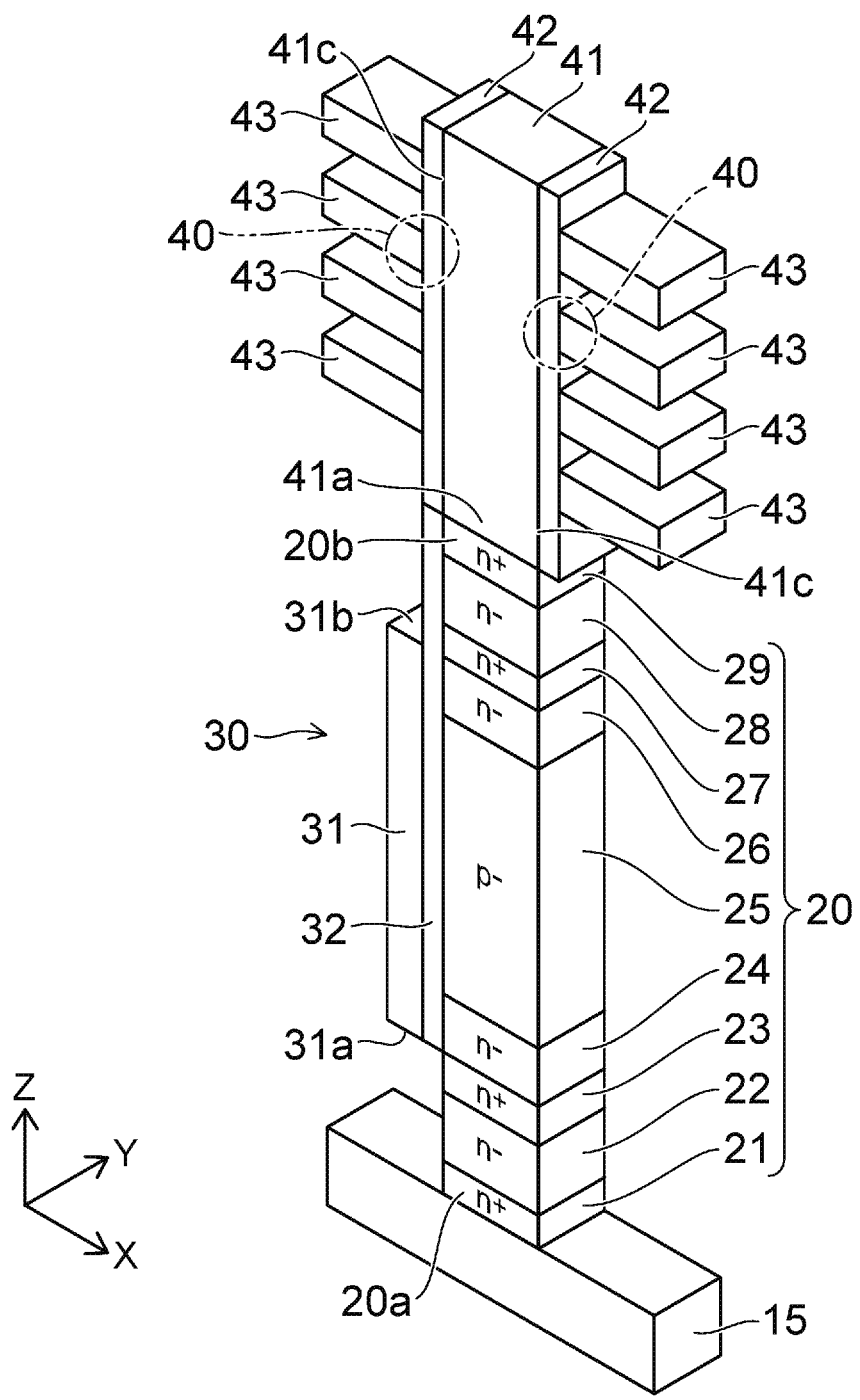
FIG. 2 is a perspective view illustrating one vertical thin film transistor (TFT) and a local bit line according to the first embodiment.

FIG. 2 is a perspective view illustrating one vertical TFT and a local bit line according to the embodiment.

Figure 3:
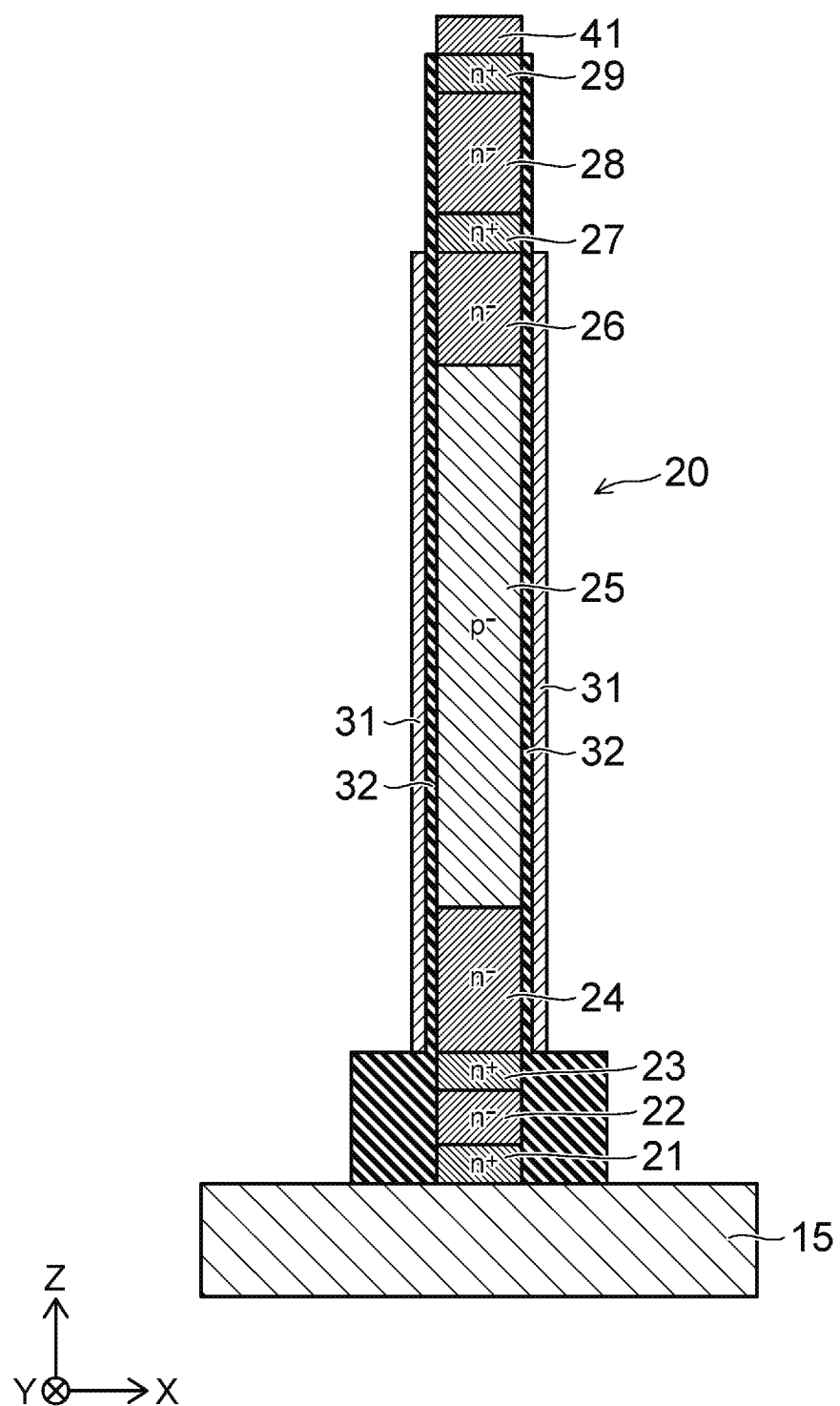
FIG. 3 is a sectional view illustrating the vertical TFT according to the first embodiment.

FIG. 3 is a sectional view illustrating the vertical TFT according to the first embodiment.

Figure 4:
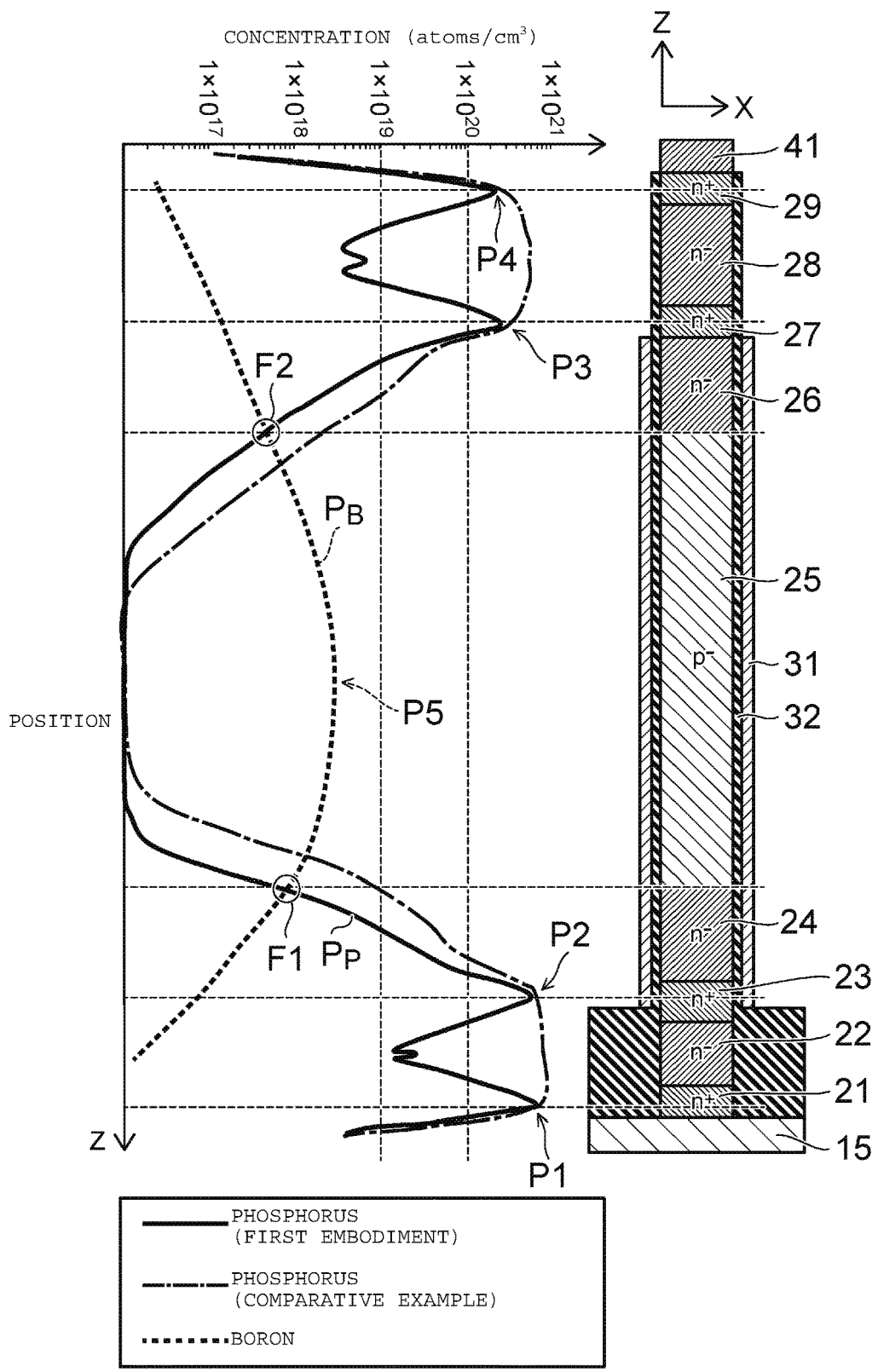
FIG. 4 is a graph illustrating an impurity concentration profile of the vertical TFT in the first embodiment when the horizontal axis represents a position and the vertical axis represents an impurity concentration.

FIG. 4 is a graph illustrating an impurity concentration profile of the vertical TFT in the embodiment when the horizontal axis represents a position and the vertical axis represents an impurity concentration.

In FIG. 4, the sectional view of the vertical TFT illustrated in FIG. 3 is illustrated together with the rest of FIG. 4. The position represented by the horizontal axis of FIG. 4 corresponds to the sectional view.

The drawings are schematic drawings which are appropriately exaggerated and omitted. Between the drawings, the number and dimension ratios of constituent elements are not necessarily matched.

The integrated circuit device according to some embodiments is a resistance-variable storage device.

As illustrated in FIGS. 1 and 2, a silicon substrate 10 is provided in an integrated circuit device 1 according to the embodiment. An interlayer insulating film 11 formed of, for example, a silicon oxide (SiO) is provided on the silicon substrate 10. Circuit elements (not illustrated) such as CMOS transistors are formed on an upper-layer portion of the silicon substrate 10 and the lower-layer portion of the interlayer insulating film 11. Conductive members (not illustrated) such as wirings and vias are formed inside the interlayer insulating film 11. Thus, a drive circuit may be formed inside the silicon substrate 10 and the interlayer insulating film 11.

A plurality of global bit lines 15 are provided on the interlayer insulating film 11. The global bit lines 15 are formed of, for example, metal such as tungsten (W). Each insulating film 16 (see FIG. 5A) formed of, for example, a silicon oxide is provided between the global bit lines 15.

Hereinafter, in the present specification, the XYZ rectangular coordinate system is adopted. A direction oriented from the silicon substrate 10 to the interlayer insulating film 11 is referred to as a "top" and the opposite direction is referred to as a "bottom." The top and the bottom are collectively referred to as a "Z direction." A direction in which the global bit line 15 extends is referred to as an "X direction" and a direction orthogonal to both the Z and X directions is referred to as a "Y direction." The fact that the "global bit line 15 extends in the X direction" means that the length of the global bit line 15 in the X direction is longer than the lengths of the global bit line 15 in the Y and Z directions. The same applies to other constituent elements and directions.

A plurality of silicon members 20 are provided on each global bit line 15. A barrier metal layer 17 (see FIG. 11B) formed of, for example, a titanium nitride (TiN) is provided between the global bit line 15 and the silicon member 20. When viewed in the Z direction, the silicon members 20 are arrayed in the X and Y directions in a matrix configuration. Each silicon member 20 has a rectangular parallelepiped shape when the Z direction is a longitudinal direction. Lower ends 20a of the plurality of silicon members 20 arrayed in one column in the X direction are connected in common to one global bit line 15 via the barrier metal layer 17.

Two gate electrodes 31 extending in the Y direction are provided between the silicon members 20 in the X direction. The gate electrodes 31 may be formed of, for example, a conductive material such as a titanium nitride. A gate insulating film 32 may be formed of, for example, a silicon oxide, and is provided between the silicon member 20 and the gate electrode 31. For example, an n channel type vertical TFT 30 is configured with the silicon member 20, the gate insulating film 32, and one pair of gate electrodes 31 interposing the silicon member 20. The vertical TFT 30 is a switching element that switches between conduction and isolation of a current.

A local bit line 41 formed of a conductive material is provided on the silicon member 20. A barrier metal layer 18 (see FIG. 11B) formed of, for example, a titanium nitride and a contact 19 (see FIG. 11B) formed of, for example, tungsten are provided between the silicon member 20 and the local bit line 41. The local bit line 41 extends in the Z direction and has, for example, a square columnar shape.

Figure 11A:
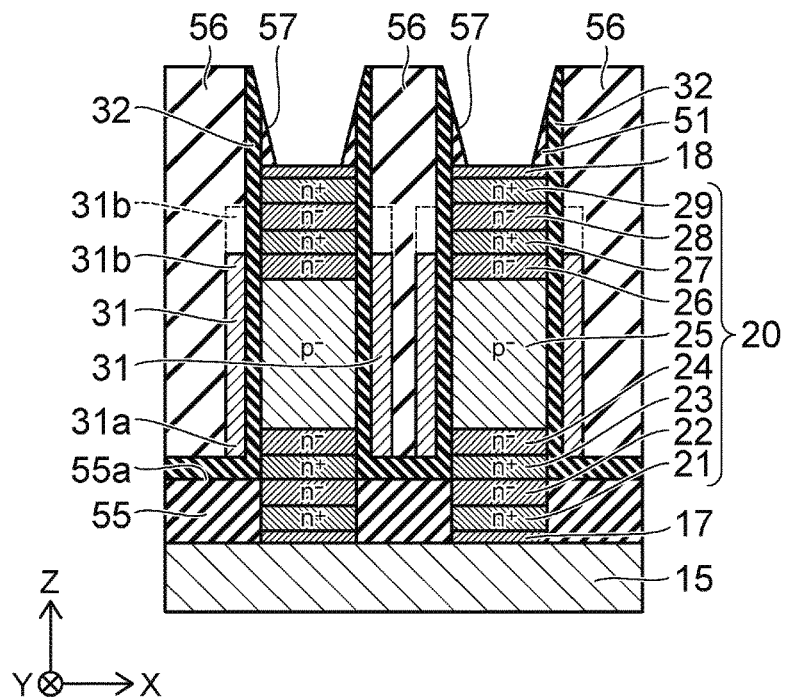
FIGS. 11A and 11B are sectional views illustrating the method of manufacturing the integrated circuit device according to the first embodiment.
Figure 11B:
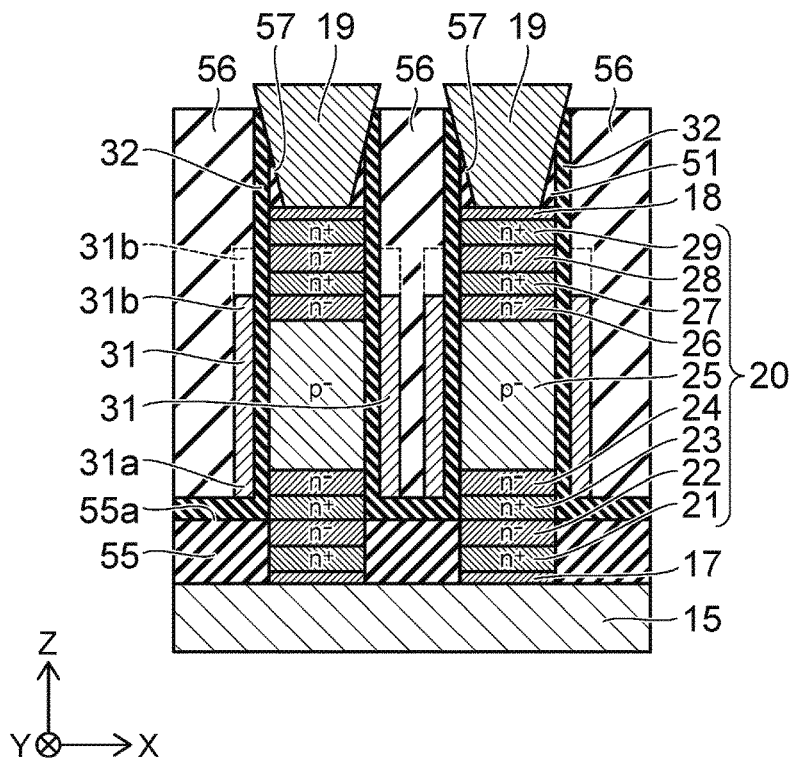

A lower end 41a of the local bit line 41 is connected to an upper end 20b of the silicon member 20 via the contact 19 (see FIG. 11B) and the barrier metal layer 18 (see FIG. 11B). Accordingly, the silicon member 20 is connected between the global bit line 15 and the local bit line 41. Since each local bit line 41 is disposed in an immediately upper region of each silicon member 20, the plurality of local bit lines 41 are arrayed in the X and Y directions in a matrix configuration in the whole integrated circuit device 1.

Resistance-variable films 42 are provided on both side surfaces 41c directed in the X direction of the local bit line 41. The resistance-variable films 42 are films of which a resistance state is varied by a voltage or a current to be applied.

A plurality of word lines 43 formed of a conductive material and extending in the Y direction are provided between the local bit lines 41 adjacent to each other in the X direction and are arrayed separately from each other in the Z direction. An insulating film (not illustrated) formed of, for example, a silicon oxide is provided between the word lines 43 adjacent to each other in the Z direction. When viewed in the Y direction, the word lines 43 are arrayed in the X and Y directions in a matrix configuration. The resistance-variable film 42 is connected between the local bit line 41 and the word line 43.

A memory cell 40 is configured at each intersection between the local bit line 41 and the word line 43 with the resistance-variable film 42 interposed therebetween. The memory cells 40 are arrayed in the X, Y, and Z directions in a three-dimensional matrix configuration.

In each silicon member 20, as illustrated in FIGS. 2 and 3, an $n^+$ portion 21, an $n^-$ portion 22, an $n^+$ portion 23, an $n^-$ portion 24, a $p^-$ portion 25, an n portion 26, an $n^+$ portion 27, an $n^-$ portion 28, and an $n^+$ portion 29 are arrayed in this order in the Z direction from the bottom, that is, from the side of the global bit line 15, to the top, that is, the side of the local bit line 41. A relation between n and p types may be reversed.

The notation of "$n^+$" and "$n^-$" types described above means that conductivity types are all n types and refers to a relative magnitude relation of the concentration of impurities serving as a donor. The donor concentration of the $n^+$ portion is higher than the donor concentration of the $n^-$ portion. The concentration of impurities serving as the donor, for example, the concentration of phosphorus (P), in the $n^+$ portion 21, the $n^+$ portion 23, the $n^+$ portion 27, and the $n^+$ portion 29 is equal to or greater than $1 \times 10^{20}$ $cm^{-3}$. In the $n^-$ portion 22, the $n^-$ portion 24, the $n^-$ portion 26, and the $n^-$ portion 28, there are portions of which the concentration of impurities serving as the donor, for example, concentration of phosphorus, is equal to or less than $1 \times 10^{19}$ $cm^{-3}$. The $p^-$ portion 25 contains impurities serving as an acceptor, for example, boron (B).

As illustrated in FIG. 4, positions F1 and F2 at which a concentration profile $P_p$ of impurities serving as a donor, for example, phosphorus, and a concentration profile $P_B$ of impurities serving as an acceptor, for example, boron, in the silicon member 20 intersect each other are a boundary between the $n^-$ portion 24 and the $p^-$ portion 25 and a boundary between the $p^-$ portion 25 and the $n^-$ portion 26, respectively.

However, since the concentration profile $P_p$ of phosphorus continuously varies, the boundaries between the n portions are not necessarily clear. In the embodiment, the boundary between the $n^+$ portion 21 and the $n^-$ portion 22, the boundary between the $n^-$ portion 22 and the $n^+$ portion 23, the boundary between the $n^+$ portion 23 and the $n^-$ portion 24, the boundary between the $n^-$ portion 26 and the $n^+$ portion 27, the boundary between the $n^+$ portion 27 and the $n^-$ portion 28, and the boundary between the $n^-$ portion 28 and the $n^+$ portion 29 are assumed to be positions at which the concentration of impurities serving as a donor is $1 \times 10^{20}$ $cm^{-3}$.

In the concentration profile $P_p$ of phosphorus in the Z direction, four large peaks P1 to P4 are formed. The peak P1 is located inside the n$^+$ portion 21, the peak P2 is located inside the n$^+$ portion 23, the peak P3 is located inside the n$^+$ portion 27, and the peak P4 is located inside the n$^+$ portion 29. At the peaks P1 to P4, the concentration of phosphorus is equal to or greater than $1\times10^{20}$ cm$^{-3}$. In the concentration profile $P_B$ of boron in the Z direction, one large peak P5 is formed. The peak P5 is located inside the p$^-$ portion 25. Accordingly, the peak P5 is located between the positions F1 and F2 and is located between the peaks P2 and P3.

When viewed in the X direction, a lower end 31a of the gate electrode 31 overlaps the n$^-$ portion 22, the n$^+$ portion 23, or the n$^-$ portion 24 and is accordingly located between the first peak P1 and the position F1. An upper end 31b of the gate electrode 31 overlaps the n$^-$ portion 26, the n$^+$ portion 27, or the n$^-$ portion 28 and is accordingly located between the position F2 and the peak P4.

Next, a method of manufacturing the integrated circuit device according to some embodiments is described focusing on a method of forming the vertical TFT 30.

FIGS. 5A to 5C, 6A and 6B, 7A and 7B, 8A and 8B, 9A and 9B, 10A and 10B, and 11A and 11B are sectional views illustrating a method of manufacturing the integrated circuit device according to some embodiments.

FIGS. 5A to 7B illustrate the YZ cross section.

FIGS. 8A to 11B illustrate the XZ cross section.

First, as illustrated in FIG. 1, the interlayer insulating film 11 is formed on the silicon substrate 10 and a drive circuit is formed in the silicon substrate 10 and the interlayer insulating film 11.

Subsequently, as illustrated in FIG. 5A, a metal film formed of, for example, tungsten is formed on the interlayer insulating film 11 and is split in a line-and-space shape extending in the X direction. Thus, the plurality of global bit lines 15 extending in the X direction are formed on the interlayer insulating film 11. Subsequently, each insulating film 16 is formed between the global bit lines 15. Subsequently, the barrier metal layer 17 formed of, for example, a titanium nitride is formed on the global bit lines 15 and the insulating films 16.

Subsequently, as illustrated in FIG. 5B, a silicon film 20f is formed on the barrier metal layer 17. For example, silicon may be deposited while introducing impurities that serve as a donor, for example, phosphorus, by a chemical vapor deposition (CVD) method. Thus, an n$^+$ layer 21a, an n$^-$ layer 22a, an n$^+$ layer 23a, an n$^-$ layer 24a, an i layer 25a, an p$^-$ layer 26a, an n$^+$ layer 27a, an n$^-$ layer 28a, and an n$^+$ layer 29a are formed in this order.

Subsequently, as illustrated in FIG. 5C, the i layer 25a is changed into a p$^-$ layer 25b by implanting ions of impurities that serves as an acceptor, for example, boron. Subsequently, phosphorus and boron are diffused and activated by performing an annealing process.

Figure 6A:
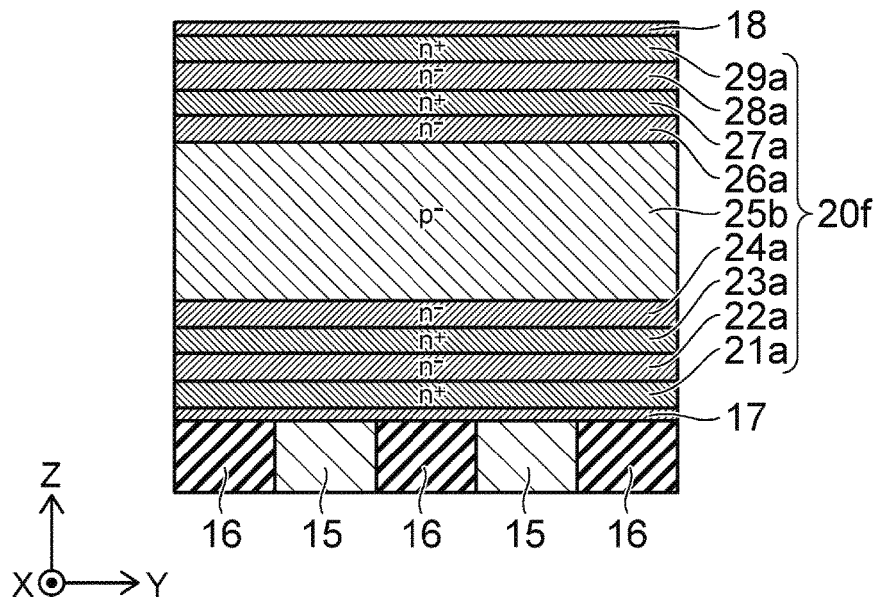
FIGS. 6A and 6B are sectional views illustrating the method of manufacturing the integrated circuit device according to the first embodiment.

Subsequently, as illustrated in FIG. 6A, the barrier metal layer 18 formed of, for example, a titanium nitride, is formed on the silicon film 20f.

Figure 6B:
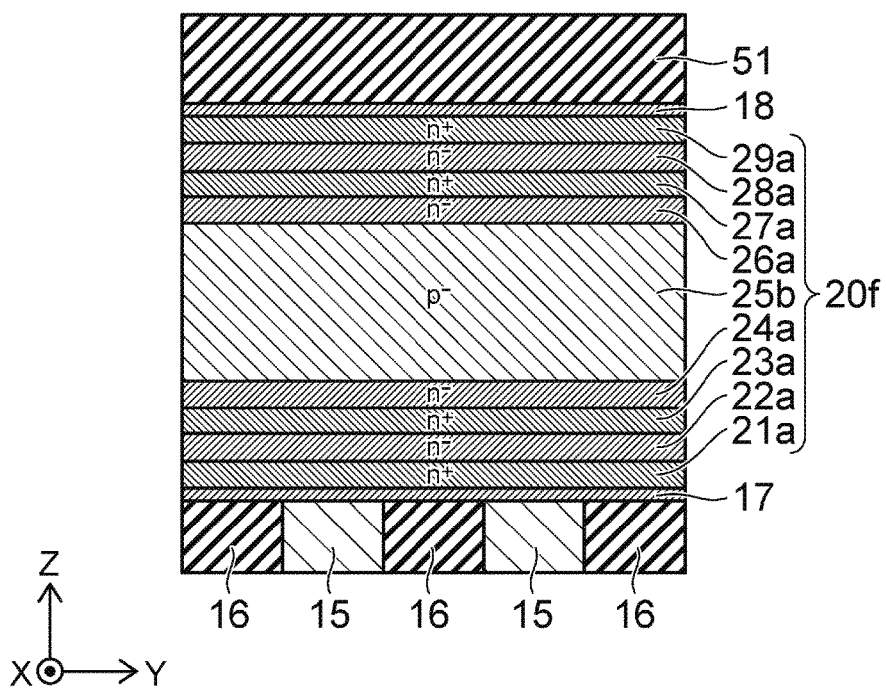

Subsequently, as illustrated in FIG. 6B, a hard mask 51 formed of, for example, a silicon nitride (SiN) is formed on the barrier metal layer 18.

Figure 7A:
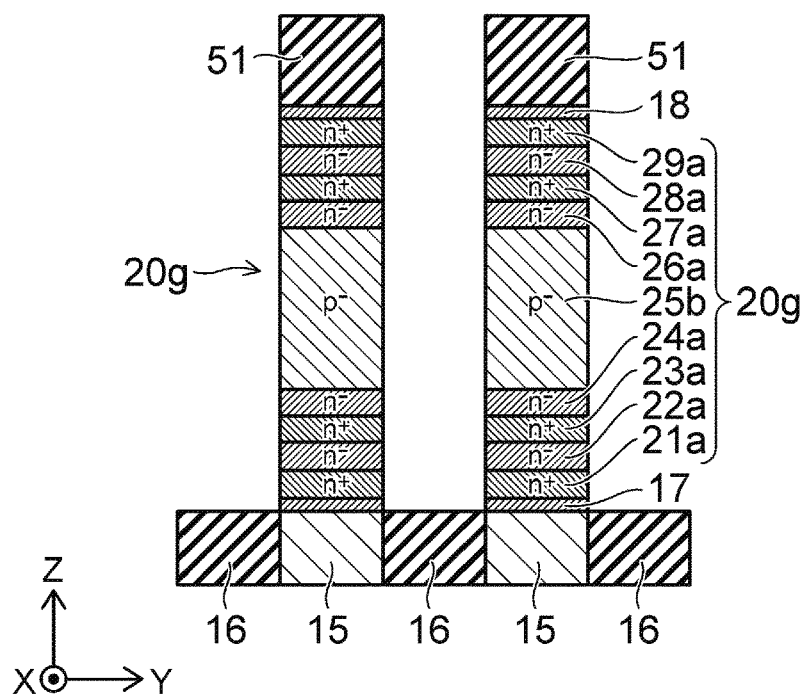
FIGS. 7A and 7B are sectional views illustrating the method of manufacturing the integrated circuit device according to the first embodiment.

Subsequently, as illustrated in FIG. 7A, the hard mask 51 may be processed in a line-and-space shape extending in the X direction by a lithographic method and a reactive ion etching (RIE) method so that the hard mask 51 remains on only the immediately upper regions of the global bit lines 15. Subsequently, by performing etching such as RIE using the processed hard mask 51 as a mask, the silicon film 20f is processed in a line-and-space shape extending in the X direction. Thus, the silicon film 20f is segmented into a plurality of silicon plates 20g.

Figure 7B:
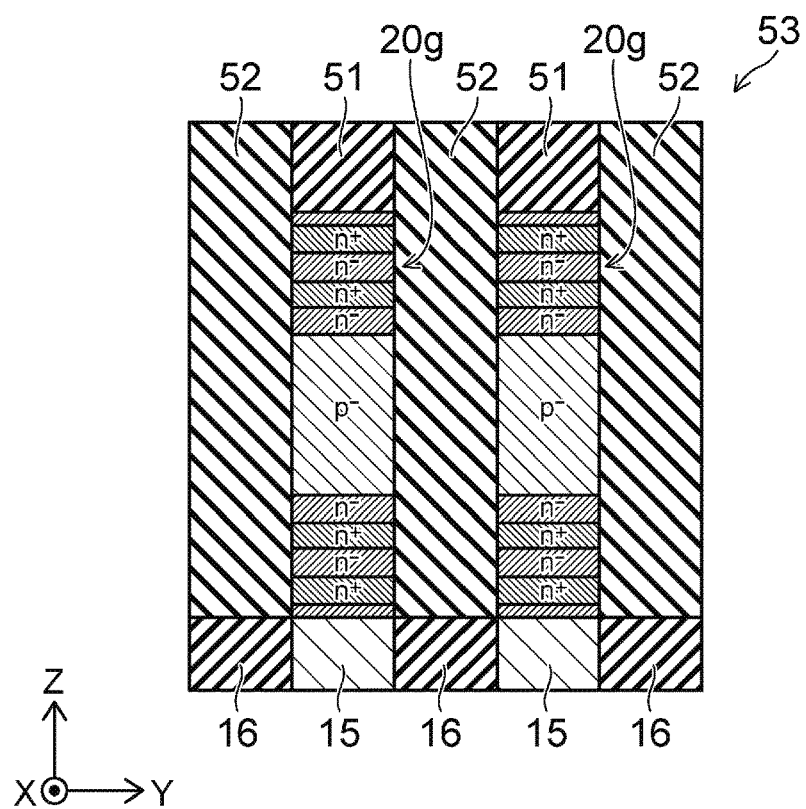

Subsequently, as illustrated in FIG. 7B, an insulating material such as a silicon oxide is buried between the silicon plates 20g and a flattening process such as chemical mechanical polishing (CMP) is performed. Thus, each insulating film 52 is formed between the silicon plates 20g. Thus, an intermediate structure 53 in which the silicon plate 20g and the insulating film 52 are alternately arrayed in the Y direction is generated.

Figure 8A:
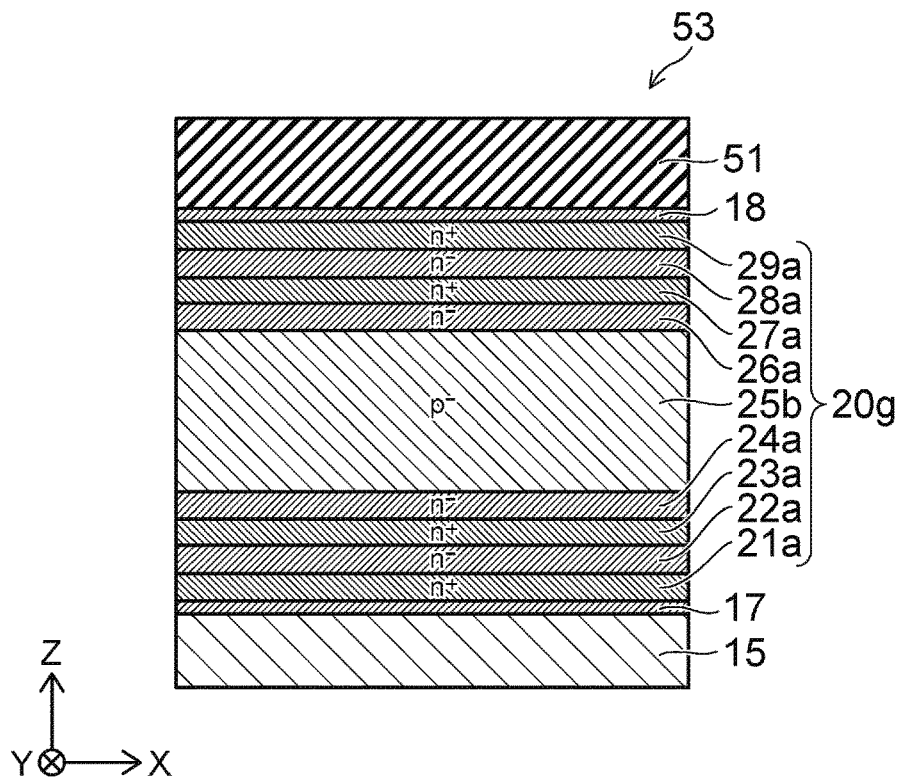
FIGS. 8A and 8B are sectional views illustrating the method of manufacturing the integrated circuit device according to the first embodiment.

FIG. 8A illustrates the XZ cross section of the intermediate structure 53.

Figure 8B:
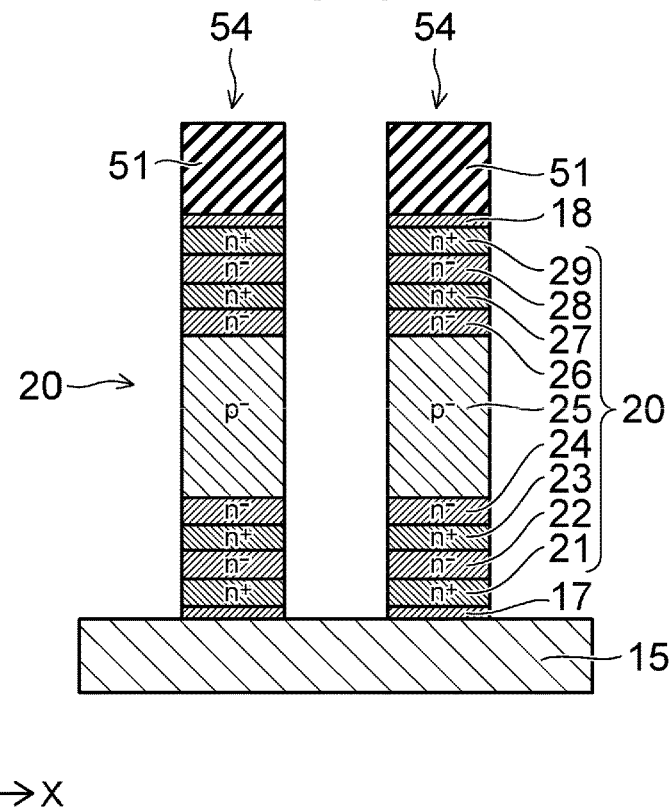

As illustrated in FIG. 8B, the intermediate structure 53 is processed in a line-and-space shape extending in the Y direction by a lithographic method and an RIE method. Thus, the intermediate structure 53 is segmented into a plurality of intermediate structures 54 extending along the YZ plane. Each silicon plate 20g is segmented into a plurality of silicon members 20 with a columnar shape.

At this time, the n$^+$ layer 21a, the n$^-$ layer 22a, the n$^+$ layer 23a, the n$^-$ layer 24a, the p$^-$ layer 25b, the p$^-$ layer 26a, the n$^+$ layer 27a, the n$^-$ layer 28a, and the n$^+$ layer 29a become the n$^+$ portion 21, the n$^-$ portion 22, the n$^+$ portion 23, the n$^-$ portion 24, the p portion 25, the n$^-$ portion 26, the n$^+$ portion 27, the n$^-$ portion 28, and the n$^+$ portion 29, respectively. In each intermediate structure 54, the silicon member 20 and the insulating film 52 (see FIG. 7B) are alternately arrayed in the Y direction.

Figure 9A:
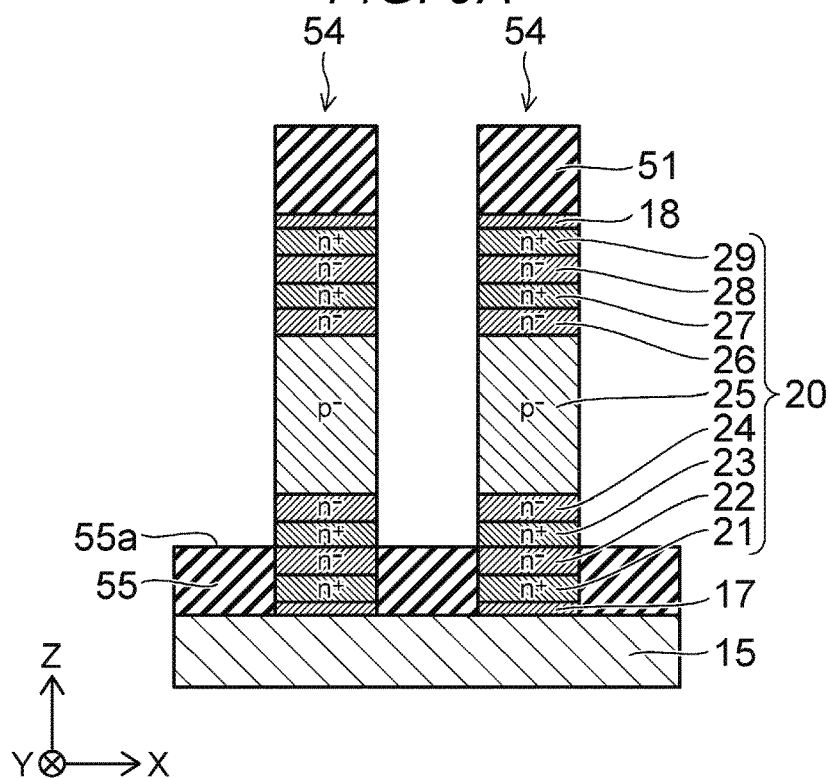
FIGS. 9A and 9B are sectional views illustrating the method of manufacturing the integrated circuit device according to the first embodiment.

Subsequently, as illustrated in FIG. 9A, for example, a silicon oxide is deposited between the intermediate structures 54 to form an insulating film 55. Subsequently, an upper surface 55a of the insulating film 55 is etched back. At this time, due to a variation in the etching, the position of the upper surface 55a varies within a given range.

Figure 9B:
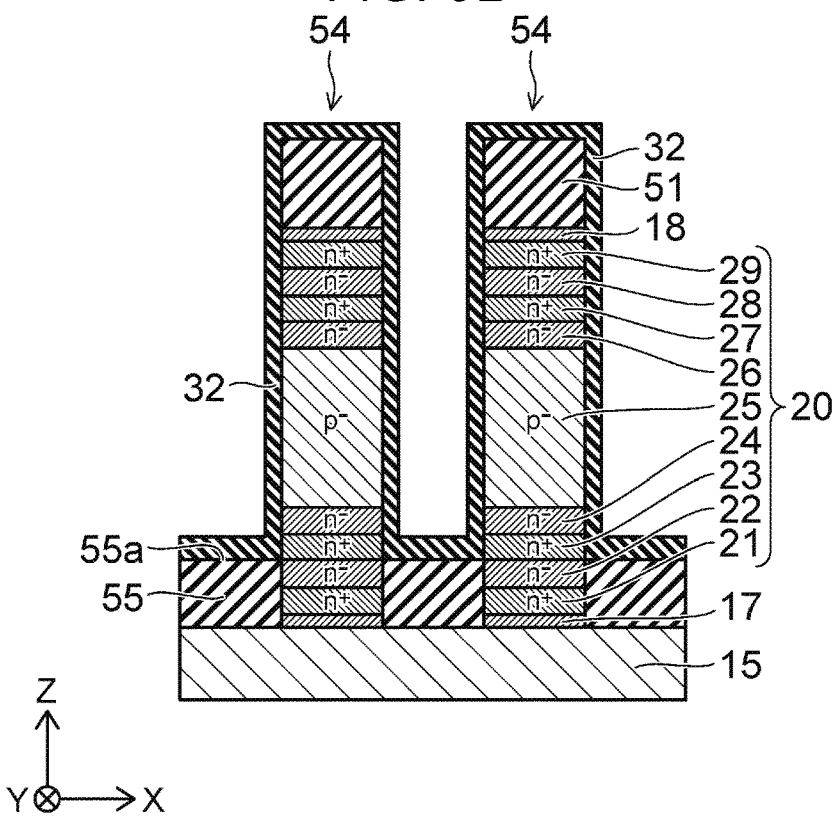

Subsequently, as illustrated in FIG. 9B, a silicon oxide film is deposited on the whole surface to form a gate insulating film 32. The gate insulating film 32 covers the upper surface 55a of the insulating film 55 and the intermediate structure 54.

Figure 10A:
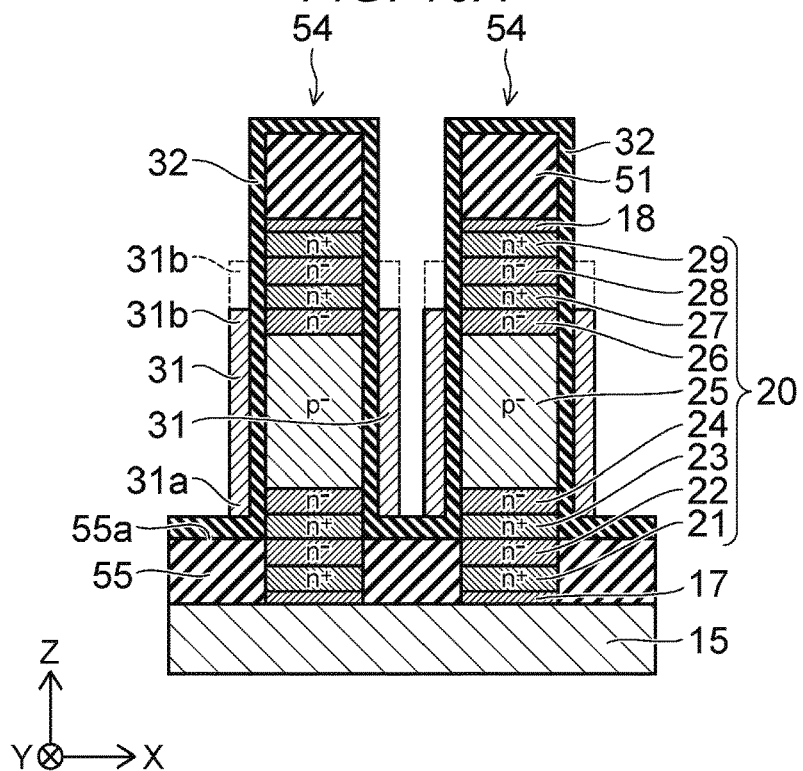
FIGS. 10A and 10B are sectional views illustrating the method of manufacturing the integrated circuit device according to the first embodiment.

Subsequently, as illustrated in FIG. 10A, for example, a conductive material such as a titanium nitride is deposited to form an electrode film on the insulating film 55. Subsequently, etching such as RIE is performed to remove the electrode film from the upper surface 55a of the insulating film 55 and from the upper portion of the side surface and the upper surface of the intermediate structure 54. Thus, gate electrodes 31 are formed on regions on the side surfaces directed in the X direction of the intermediate structure 54 except for the upper portion.

At this time, due to a variation in the position of the upper surface 55a of the insulating film 55, the position of a lower end 31a of the gate electrode 31 in the Z direction varies within a given range. Due to a variation in the etching on the electrode film, the position of an upper end 31b of the gate electrode 31 in the Z direction varies within a given range. In FIG. 10A and the subsequent drawings, a variation range of the position of the upper end 31b of the gate electrode 31 is indicated by a dotted line.

Figure 10B:
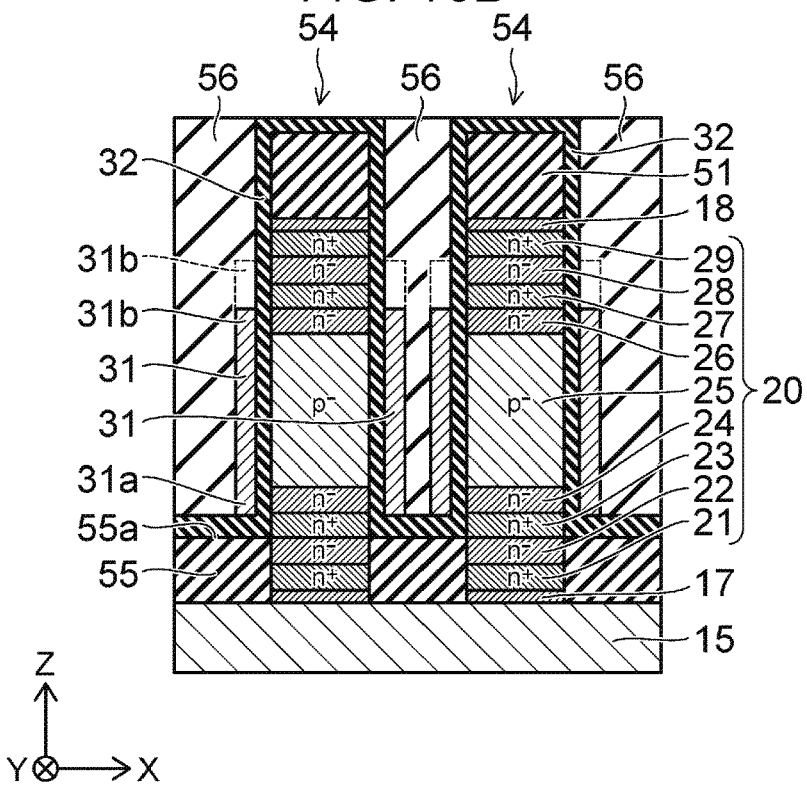

Subsequently, as illustrated in FIG. 10B, for example, a silicon oxide may be deposited to form each insulating film 56 between the intermediate structures 54. The insulating film 56 also buries the gate electrode 31.

Subsequently, as illustrated in FIG. 11A, a contact hole 57 is formed in the hard mask 51. The barrier metal layer 18 is exposed on the bottom surface of the contact hole 57.

Subsequently, as illustrated in FIG. 11B, for example, tungsten may be buried to form the contact 19 inside the contact hole 57. The contact 19 is connected to the $n^+$ portion 29 of the silicon member 20 with the barrier metal layer 18 interposed therebetween.

Subsequently, as illustrated in FIG. 1, the word lines 43, the resistance-variable films 42, and the local bit lines 41 are formed by normal processes. The local bit line 41 is connected to the contact 19. In this way, the integrated circuit device 1 according to some embodiments is manufactured.

Next, effects of some embodiments is described.

In the integrated circuit device 1 according to some embodiments, as illustrated in FIG. 3, when viewed in the X direction, the lower end 31a of the gate electrode 31 overlaps the $n^-$ portion 22, the $n^+$ portion 23, or the $n^-$ portion 24 and does not overlap the $n^+$ portion 21. Therefore, the global bit line 15 and the gate electrode 31 are separated from each other by the thickness of at least the $n^+$ portion 21. As a result, it is possible to prevent short-circuiting between the global bit line 15 and the gate electrode 31.

Similarly, when viewed in the X direction, the upper end 31b of the gate electrode 31 overlaps the $n^-$ portion 28, the $n^+$ portion 27, or the $n^-$ portion 26 and does not overlap the $n^+$ portion 29. Therefore, the local bit line 41 and the gate electrode 31 are separated from each other by the thickness of at least the $n^+$ portion 29. As a result, it is possible to prevent short-circuiting between the local bit line 41 and the gate electrode 31.

On the other hand, when viewed in the X direction, the gate electrode 31 overlaps at least a part of the $n^-$ portion 24 and a part of the $n^-$ portion 26. That is, the gate electrode 31 overlaps the source and drain of the n type. Therefore, the vertical TFT 30 has a large ON current.

At this time, by causing a total length of the $n^-$ portion 22, the $n^+$ portion 23, and the $n^-$ portion 24 in the Z direction to be longer than a range of a variation in the position of the lower end 31a of the gate electrode 31, it is possible to ensure a fixed value equal to or greater a distance between the global bit line 15 and the gate electrode 31 even when the position of the lower end 31a of the gate electrode 31 varies due to a variation in the etching on the insulating film 55 in the process illustrated in FIG. 10A. Thus, it is possible to reliably prevent short-circuiting between the global bit line 15 and the gate electrode 31. By overlapping the gate electrode 31 with at least a part of the $n^-$ portion 24, it is possible to ensure an ON current.

Similarly, by causing a total length of the $n^-$ portion 26, the $n^+$ portion 27, and the $n^-$ portion 28 in the Z direction to be longer than a range of a variation in the position of the upper end 31b of the gate electrode 31, it is possible to ensure a fixed value equal to or greater than a distance between the local bit line 41 and the gate electrode 31 even when the position of the upper end 31b of the gate electrode 31 varies due to a variation in the etching on the electrode film in the process illustrated in FIG. 10A. Thus, it is possible to reliably prevent short-circuiting between the local bit line 41 and the gate electrode 31. By overlapping the gate electrode 31 with at least a part of the $n^-$ portion 26, it is possible to ensure an ON current.

To increase the ON current of the vertical TFT 30, an overlapping amount of the gate electrode 31 with a source and a drain may be designed to be large. However, in this case, a gate-induced drain leakage (GIDL) easily occurs in the overlapping portion of the silicon member 20 with the gate electrode 31, and thus an OFF current of the vertical TFT 30, that is, a leakage current may increase.

Accordingly, in some embodiments, when viewed in the X direction, the $n^-$ portion 22, the $n^-$ portion 24, the $n^-$ portion 28, and the $n^-$ portion 26 in which phosphorus concentration is low are disposed in an overlapping portion of the silicon member 20 with the gate electrode 31. Thus, it is possible to prevent GIDL and reduce the OFF current of the vertical TFT 30.

In the lower end of the silicon member 20, the $n^+$ portion 21 with the high phosphorus concentration is disposed. Thus, it is possible to reduce the resistance of the silicon member 20 and the global bit line 15. Similarly, in the upper end of the silicon member 20, the $n^+$ portion 29 with the high phosphorus concentration is disposed. Thus, it is possible to reduce the resistance of the silicon member 20 and the local bit line 41. As described above, the $n^+$ portion 21 and the $n^+$ portion 29 do not overlap the gate electrode 31 when viewed in the X direction. Therefore, an increase in GIDL due to the $n^+$ portion 21 and the $n^+$ portion 29 does not occur.

Further, in the silicon member 20, the $n^+$ portion 23 is disposed between the $n^-$ portion 22 and the $n^-$ portion 24. Thus, in the annealing process illustrated in FIG. 5C, phosphorus can be diffused from the $n^+$ portion 23 to the $n^-$ portion 22 and the $n^-$ portion 24. As a result, even when a total length of the $n^-$ portion 22, the $n^+$ portion 23, and the $n^-$ portion 24 in the Z direction is enlarged to absorb a variation in the position of the lower end 31a of the gate electrode 31, phosphorus can be reliably supplied to the $n^-$ portion 22 and the $n^-$ portion 24. As a result, it is possible to ensure the ON current of the vertical TFT 30.

Similarly, in the silicon member 20, the $n^+$ portion 27 is disposed between the $n^-$ portion 26 and the $n^-$ portion 28. Thus, in the annealing process illustrated in FIG. 5C, phosphorus can be diffused from the $n^+$ portion 27 to the $n^-$ portion 26 and the $n^-$ portion 28. As a result, even when a total length of the $n^-$ portion 26, the $n^+$ portion 27, and the $n^-$ portion 28 in the Z direction is enlarged to absorb a variation in the position of the upper end 31b of the gate electrode 31, phosphorus can be reliably supplied to the $n^-$ portion 26 and the $n^-$ portion 28. As a result, it is possible to ensure the ON current of the vertical TFT 30.

There is a possibility of GIDL occurring due to the $n^+$ portion 23 and the $n^+$ portion 27. However, since the $n^+$ portion 23 is interposed between the $n^-$ portion 22 and the n portion 24 and the $n^+$ portion 27 is interposed between the $n^-$ portion 26 and the $n^-$ portion 28, the influence of GIDL can be restricted within an allowable range by regulating the thicknesses of the $n^+$ portion 23 and the $n^+$ portion 27.

Next, the above-described effects will be described giving an experiment example.

Figure 12A:
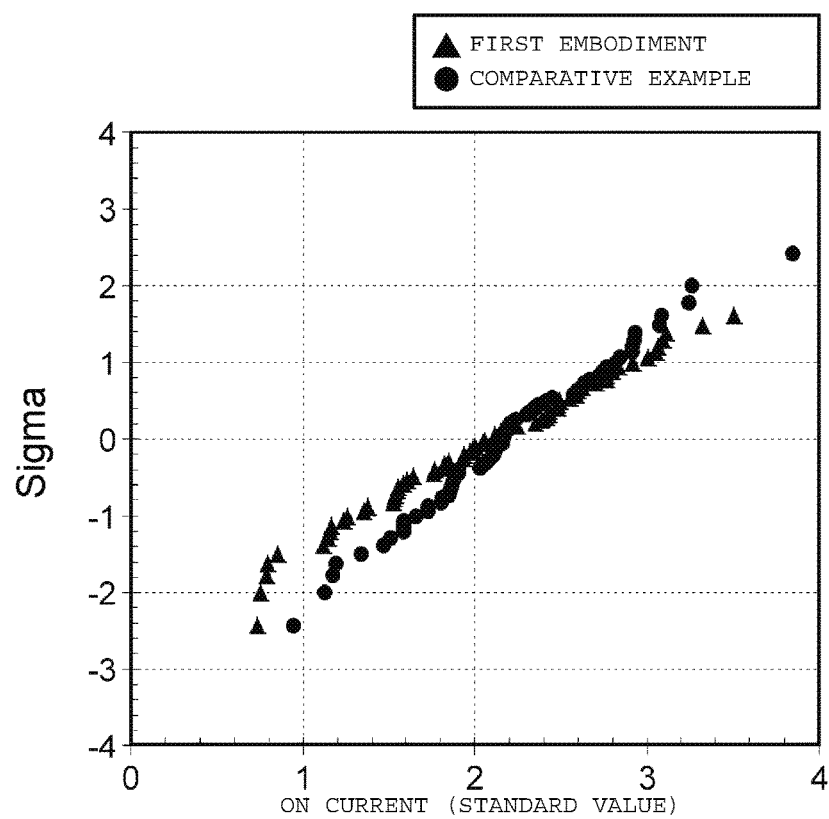
FIG. 12A is a sigma plot diagram illustrating a distribution of an ON current flowing in one vertical TFT when the horizontal axis represents a standard value of the ON current as a straight axis and the vertical axis represents a sample.
Figure 12B:
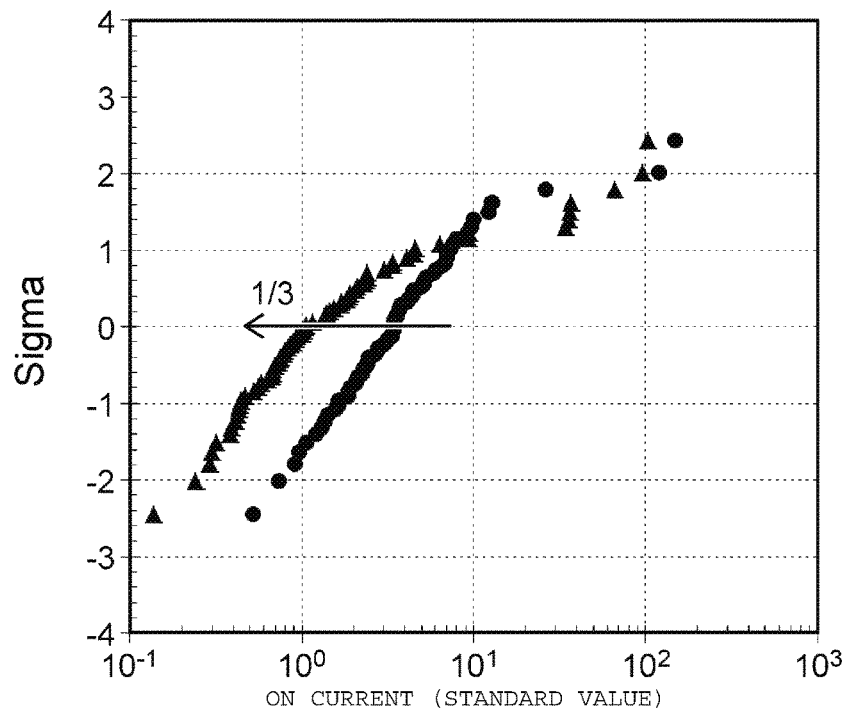
FIG. 12B is a sigma plot diagram illustrating a distribution of an OFF current flowing in one vertical TFT when the horizontal axis represents a standard value of the OFF current as a logarithmic axis and the vertical axis represents a sample.

FIG. 12A is a sigma plot diagram illustrating a distribution of an ON current flowing in one vertical TFT when the horizontal axis represents a standard value of an ON current as a straight axis and the vertical axis represents a sample and FIG. 12B is a sigma plot diagram illustrating a distribution of an OFF current flowing in one vertical TFT when the horizontal axis represents a standard value of an OFF current as a logarithmic axis and the vertical axis represents a sample.

A comparative example illustrated in FIGS. 12A and 12B is the same as the comparative example of FIG. 4. That is, a one-dot chain line of FIG. 4 indicates the concentration profile of phosphorus in the comparative example. The concentration profile of boron in the comparative example is the same as that of the first embodiment. In the comparative example, as illustrated in FIG. 4, the $n^-$ portion 22 and the $n^-$ portion 28 are not provided. When viewed in the X direction, the gate electrode 31 overlaps an n⁺ portion provided continuously from both ends of the silicon member 20 in the Z direction.

As illustrated in FIG. 12A, the ON current is not almost changed in the integrated circuit device 1 according to the embodiment, compared to the integrated circuit device according to the comparative example. It is considered that this affect is due to the resistance between the global bit line 15 and the local bit line 41 being reduced by providing the n⁺ portion 21 and the n⁺ portion 29 and a donor reliably supplied to the n⁻ portion 22, the n⁻ portion 24, the n⁻ portion 26, and the n⁻ portion 28 by providing the n⁺ portion 23 and the n⁺ portion 27.

On the other hand, as illustrated in FIG. 12B, in the integrated circuit device 1 according to some embodiments, the OFF current is reduced to about one third, compared to the integrated circuit device according to the comparative example. It is considered that this is due to GIDL being reduced by disposing the n⁻ portion 22, the n⁻ portion 24, the n⁻ portion 26, and the n⁻ portion 28 in the overlapping portion of the silicon member 20 with the gate electrode 31.

In this way, according to some embodiments, it is possible to achieve the integrated circuit device capable of reducing the OFF current and consuming less power while ensuring the ON current.

Second Embodiment

Next, a second embodiment will be described.

Figure 13:
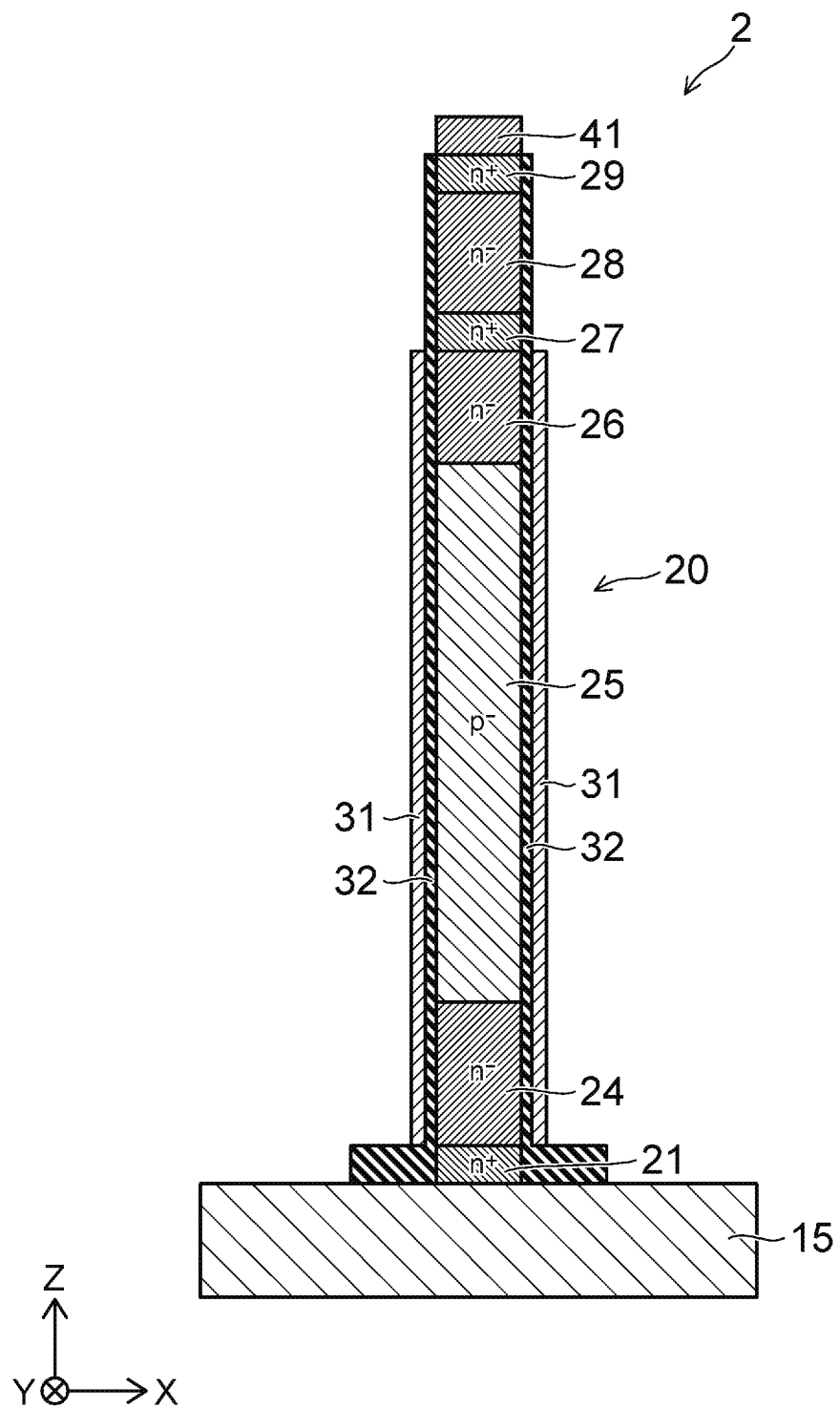
FIG. 13 is a sectional view illustrating a vertical TFT in an integrated circuit device according to a second embodiment.

FIG. 13 is a sectional view illustrating a vertical TFT in an integrated circuit device according to some embodiments.

As illustrated in FIG. 13, an integrated circuit device 2 according to some embodiments is different from the integrated circuit device 1 (see FIG. 3) according to the above-described first embodiment in that the n⁻ portion 22 and the n⁺ portion 23 are not provided in the lower portion of the silicon member 20. The structure of the upper portion of the silicon member 20 is the same as that of the first embodiment. The other remaining configuration and the manufacturing method in the embodiment are the same as those of the first embodiment.

According to the embodiment, the same effects as those of the first embodiment can be obtained for the upper portion of the silicon member 20. That is, even when the position of the upper end 31b of the gate electrode 31 varies, it is possible to prevent GIDL in the upper portion of the silicon member 20 while preventing the short-circuiting of the gate electrode 31 and the local bit line 41. As a result, it is possible to reduce the OFF current while ensuring the ON current of the vertical TFT 30.

Third Embodiment

Next, a third embodiment will be described.

Figure 14:
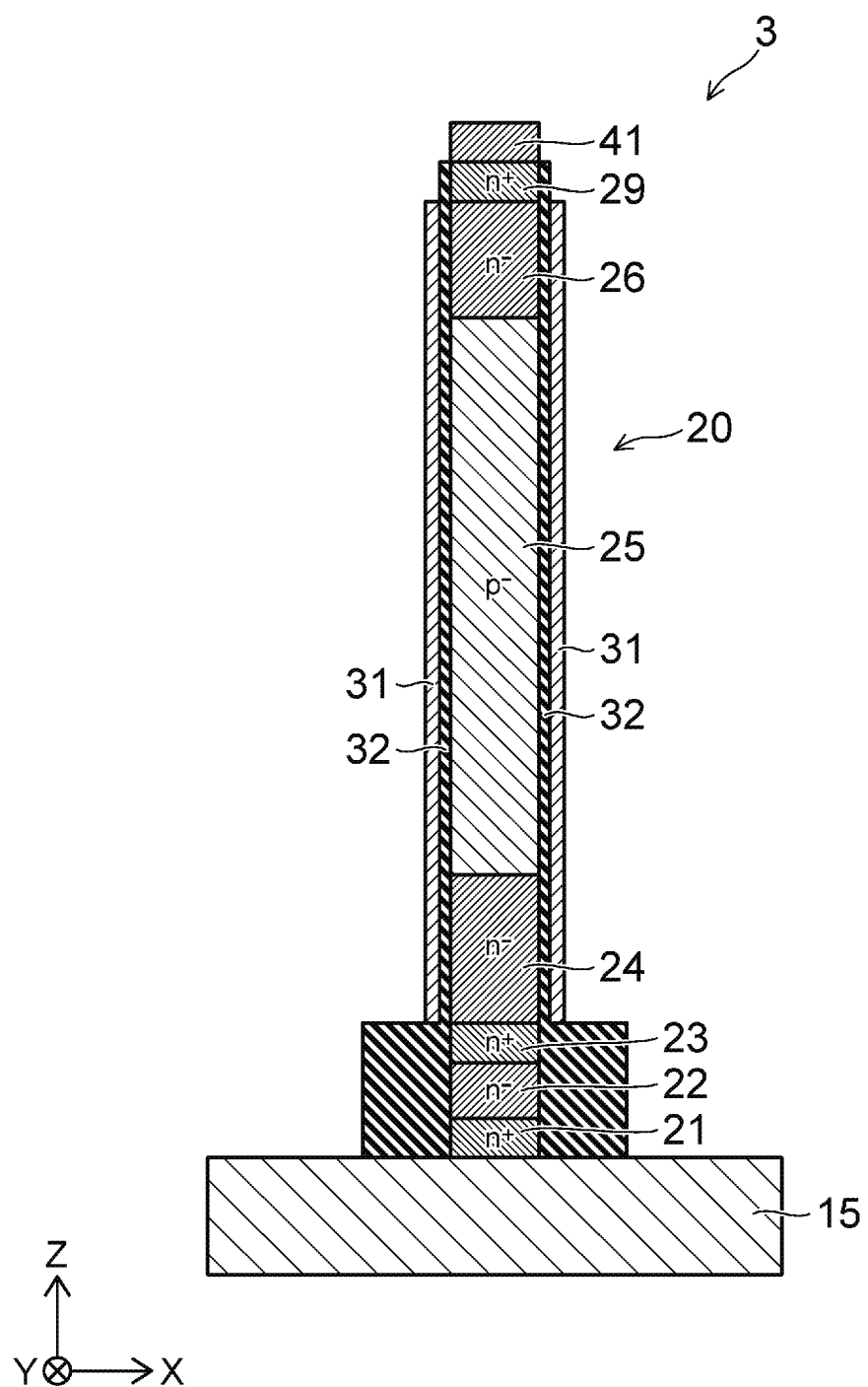
FIG. 14 is a sectional view illustrating a vertical TFT in an integrated circuit device according to a third embodiment.

FIG. 14 is a sectional view illustrating a vertical TFT in an integrated circuit device according to some embodiments.

As illustrated in FIG. 14, an integrated circuit device 3 according to some embodiments is different from the integrated circuit device 1 (see FIG. 3) according to the above-described first embodiment in that the n⁻ portion 28 and the n⁺ portion 27 are not provided in the upper portion of the silicon member 20. The structure of the lower portion of the silicon member 20 is the same as that of the first embodiment. The other remaining configuration and the manufacturing method in the third embodiment are the same as those of the first embodiment.

According to the third embodiment, the same effects as those of the first embodiment can be obtained for the lower portion of the silicon member 20. That is, even when the position of the lower end 31a of the gate electrode 31 varies, it is possible to prevent GIDL in the lower portion of the silicon member 20 while preventing the short-circuiting of the gate electrode 31 and the global bit line 15. As a result, it is possible to reduce the OFF current while ensuring the ON current of the vertical TFT 30.

Fourth Embodiment

Next, a fourth embodiment will be described.

Figure 15:
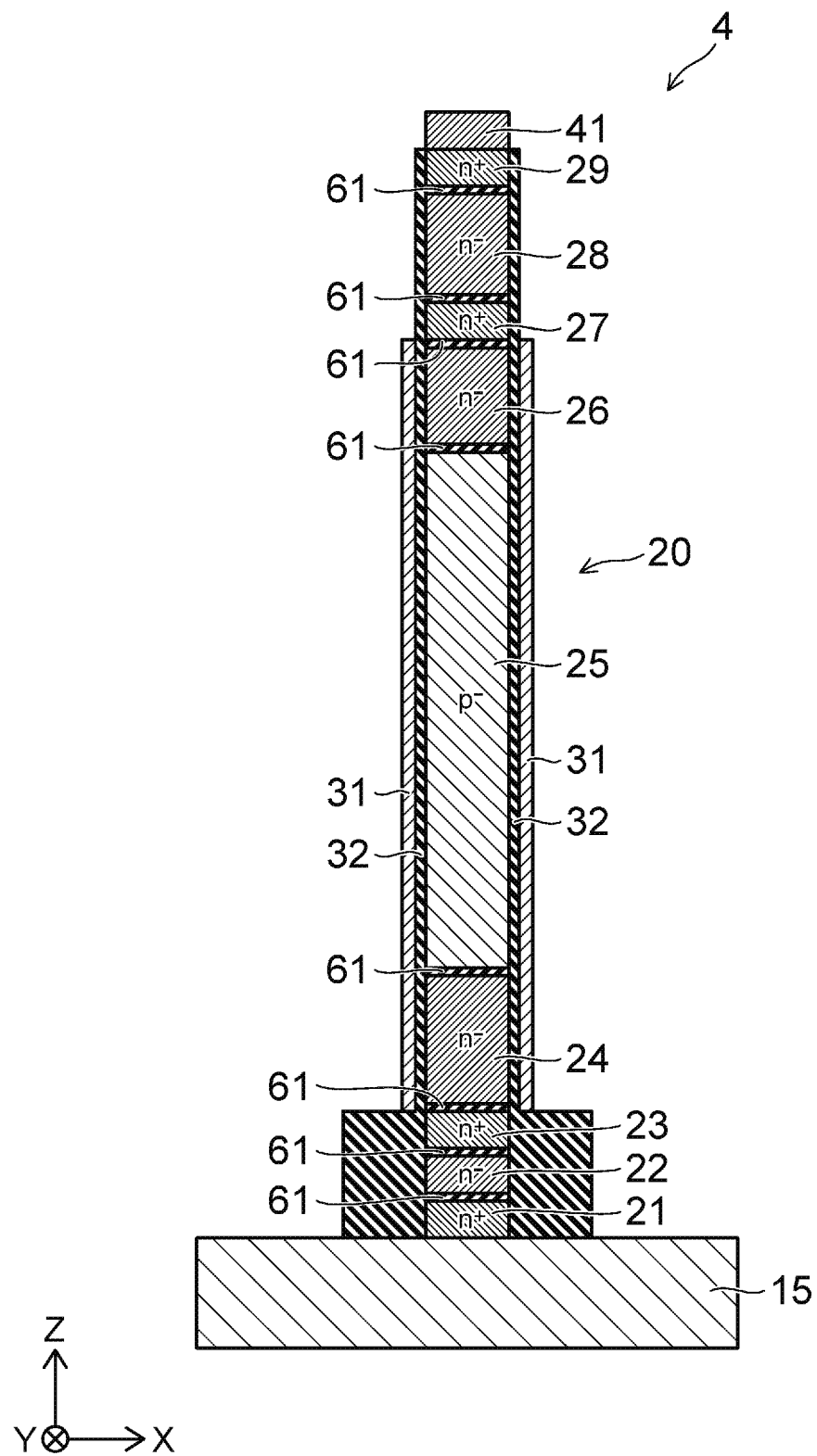
FIG. 15 is a sectional view illustrating a vertical TFT in an integrated circuit device according to a fourth embodiment.

FIG. 15 is a sectional view illustrating a vertical TFT in an integrated circuit device according to some embodiments.

As illustrated in FIG. 15, in an integrated circuit device 4 according to the fourth embodiment, a plurality of silicon oxide layers 61 are provided in addition to the configuration of the integrated circuit device 1 (see FIG. 3) according to the above-described first embodiment. The silicon oxide layers 61 are provided between the n⁺ portion 21 and the n⁻ portion 22, between the n⁻ portion 22 and the n⁺ portion 23, between the n⁺ portion 23 and the n⁻ portion 24, between the n⁻ portion 24 and the p⁻ portion 25, between the p⁻ portion 25 and the n⁻ portion 26, between the n⁻ portion 26 and the n⁺ portion 27, between the n⁺ portion 27 and the n⁻ portion 28, and between the n⁻ portion 28 and the n≥portion 29, respectively. Only some of the silicon oxide layers 61 may be installed between these portions.

For example, in the process of depositing the silicon film 20f illustrated in FIG. 5B, the silicon oxide layers 61 can be formed by introducing the atmospheric air in a chamber of a CVD device or extracting an intermediate structure from a chamber to naturally oxidize the upper surfaces of deposited layers of silicon after forming these layers by a CVD method.

According to the fourth embodiment, since the silicon oxide layers 61 prevents diffusion of impurities in the annealing process illustrated in FIG. 5C and a subsequent thermal treatment process, sharp peaks of the impurity concentration profile illustrated in FIG. 4 may be maintained. As a result, the effects described in the first embodiment are more noticeable.

The other remaining configuration, the manufacturing method, and effects in the fourth embodiment are the same as those of the above-described first embodiment.

According to the above-described embodiments, it is possible to achieve the integrated circuit device capable of consuming less power.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In the above-described embodiments, the integrated circuit device is described as an example of a resistance-variable storage device, but an exemplary embodiment of the present disclosure is not limited thereto. For example, the vertical TFT 30 described in the embodiments can also be used as a select transistor that selects a silicon pillar which is the body of a metal-oxide-nitride-oxide-silicon (MONOS) transistor in a storage device in which the MONOS transistor is used as a memory cell. Alternatively, the vertical TFT 30 may be provided in an integrated circuit device other than a storage device.

What is claimed is:

1. An integrated circuit device comprising:
   a first wiring;
   a second wiring;
   a semiconductor member connected between the first and second wiring;
   an electrode; and
   an insulating film provided between the semiconductor member and the electrode,
   wherein the semiconductor member comprises:
      a first semiconductor portion of a first conductivity type connected to the first wiring,
      a second semiconductor portion of the first conductivity type in which a concentration of a first impurity is lower than a concentration of the first impurity of the first semiconductor portion,
      a third semiconductor portion of the first conductivity type in which the concentration of the first impurity is higher than the concentration of the first impurity of the second semiconductor portion,
      a fourth semiconductor portion of the first conductivity type in which the concentration of the first impurity is lower than the concentration of the first impurity of the third semiconductor portion,
      a fifth semiconductor portion of a second conductivity type, and
      a sixth semiconductor portion of the first conductivity type,
   the first, second, third, fourth, fifth, and sixth semiconductor portions are arranged in this order in a first direction oriented from the first wiring to the second wiring, and
   when viewed in a second direction oriented from the electrode to the semiconductor member, a first edge of the electrode on a side of the first wiring overlaps at least one of the second, third, or fourth semiconductor portions.

2. The integrated circuit device according to claim 1, further comprising:
   a third wiring extending in a direction intersecting the first direction; and
   a resistance-variable film connected between the second and third wirings.

3. The integrated circuit device according to claim 1, further comprising:
   a third wiring extending in a direction intersecting the first direction; and
   a resistance-variable film connected between the first and third wirings.

4. The integrated circuit device according to claim 1, wherein the semiconductor member further comprises:
   a seventh semiconductor portion of the first conductivity type in which the concentration of the first impurity is higher than the concentration of the first impurity of the sixth semiconductor portion,
   an eighth semiconductor portion of the first conductivity type in which the concentration of the first impurity is lower than the concentration of the first impurity of the seventh semiconductor portion, and
   a ninth semiconductor portion of the first conductivity type in which the concentration of the first impurity is higher than the concentration of the first impurity of the eighth semiconductor portion,
   the second wiring is connected to the ninth semiconductor member,
   the fifth, sixth, seventh, eighth, and ninth semiconductor portions are arranged in this order in the first direction, and
   when viewed in the second direction, a second edge of the electrode on a side of the second wiring overlaps at least one of the sixth, seventh, or eighth semiconductor portions.

5. The integrated circuit device according to claim 1, wherein the semiconductor member further comprises:
   a first oxide layer provided between the first and second semiconductor portions,
   a second oxide layer provided between the second and third semiconductor portions,
   a third oxide layer provided between the third and fourth semiconductor portions,
   a fourth oxide layer provided between the fourth and fifth semiconductor portions, and
   a fifth oxide layer provided between the fifth and sixth semiconductor portions.

6. The integrated circuit device according to claim 1, where the electrode is a gate electrode.

7. The integrated circuit device according to claim 1, where the integrated circuit device is a vertical thin film transistor (TFT).

8. The integrated circuit device according to claim 1, where first wiring and the second wiring are bit lines.

9. The integrated circuit device according to claim 8, where first wiring is one of a local bit line or a global bit line, and the second wiring is another of a local bit line or a global bit line.

10. The integrated circuit device according to claim 8, further comprising a word line.

11. An integrated circuit device comprising:
    a first wiring;
    a second wiring;
    a semiconductor member connected between the first and second wirings;
    an electrode; and
    an insulating film provided between the semiconductor member and the electrode,
    wherein the semiconductor member contains a first impurity used to form the semiconductor member as a first conductivity type and a second impurity used to form the semiconductor member as a second conductivity type,
    a concentration profile of the first impurity in a first direction oriented from the first wiring to the second wiring in the semiconductor member has first, second, and third peaks,
    a concentration profile of the second impurity in the first direction in the semiconductor member has a fourth peak,
    the fourth peak is located between the second and third peaks in the first direction, and
    when viewed in a second direction oriented from the electrode to the semiconductor member, a first edge of the electrode on a side of the first wiring is located between the first peak and a position at which the concentration profile of the first impurity and the concentration profile of the second impurity intersect each other.

12. The integrated circuit device according to claim 11, where the electrode is a gate electrode.

13. The integrated circuit device according to claim 11, where the integrated circuit device is a vertical thin film transistor (TFT).

14. The integrated circuit device according to claim 11, where first wiring and the second wiring are bit lines.

15. The integrated circuit device according to claim 13, where first wiring is one of a local bit line or a global bit line, and the second wiring is another of a local bit line or a global bit line.

* * * * *